(12) United States Patent
Himi et al.

(10) Patent No.: US 7,479,849 B2
(45) Date of Patent: Jan. 20, 2009

(54) DIELECTRIC RESONATOR DEVICE, OSCILLATOR AND TRANSMITTER-RECEIVER APPARATUS

(75) Inventors: Yoshihiro Himi, Yokohama (JP); Hiroshi Nishida, Yokohama (JP); Koichi Sakamoto, Otsu (JP)

(73) Assignee: Murata Manufacturing Co., Ltd (JP)

( * ) Notice: Subject to any disclaimer, the term of this patent is extended or adjusted under 35 U.S.C. 154(b) by 166 days.

(21) Appl. No.: 10/572,587

(22) PCT Filed: Sep. 27, 2004

(86) PCT No.: PCT/JP2004/014053

§ 371 (c)(1),
(2), (4) Date: Sep. 26, 2006

(87) PCT Pub. No.: WO2005/034280

PCT Pub. Date: Apr. 14, 2005

(65) Prior Publication Data

US 2007/0126534 A1    Jun. 7, 2007

(30) Foreign Application Priority Data

Sep. 30, 2003    (JP)    ............................. 2003-340975

(51) Int. Cl.
*H01P 7/10*    (2006.01)
(52) U.S. Cl. ..................... 333/134; 333/202; 333/219.1
(58) Field of Classification Search .................. 333/134, 333/204, 202, 219.1; 331/68, 96
See application file for complete search history.

(56) References Cited

U.S. PATENT DOCUMENTS

| | | | | |
|---|---|---|---|---|
| 6,016,090 A * | 1/2000 | Iio et al. | ....................... | 333/202 |
| 6,172,572 B1 * | 1/2001 | Kajikawa et al. | .............. | 331/96 |
| 6,204,739 B1 * | 3/2001 | Sakamoto et al. | ......... | 333/219.1 |
| 6,236,279 B1 * | 5/2001 | Fujii et al. | ..................... | 331/68 |
| 6,369,676 B2 * | 4/2002 | Sakamoto et al. | ......... | 333/219.1 |
| 6,388,541 B1 * | 5/2002 | Hiratsuka et al. | ............ | 333/134 |
| 2003/0234695 A1* | 12/2003 | Haruta et al. | .................. | 331/68 |

FOREIGN PATENT DOCUMENTS

| | | |
|---|---|---|
| JP | 58-110059 | 6/1983 |
| JP | 61-270902 A | 12/1986 |
| JP | 7-038311 A | 2/1995 |

(Continued)

OTHER PUBLICATIONS

International Search Report dated 11/2/004, and English Translation.
Written Opinion dated Nov. 2, 2004, and English Translation.

(Continued)

*Primary Examiner*—Vibol Tan
(74) *Attorney, Agent, or Firm*—Dickstein, Shapiro, LLP.

(57) ABSTRACT

A dielectric resonator device including a circuit substrate with a top surface provided with transmission lines, and a bottom surface provided with a ground electrode; a dielectric substrate with opposite surfaces that are respectively provided with electrodes having circular openings so as to form a TE010-mode resonator; and an insulating layer disposed between the ground electrode of the circuit substrate and the electrodes of the TE010-mode resonator. The TE010-mode resonator is attached to the circuit substrate with an insulative adhesive. Accordingly, a current path remains unchanged even if the circuit substrate and the TE010-mode resonator are partially disengaged from each other, thereby achieving stable characteristics.

10 Claims, 7 Drawing Sheets

FOREIGN PATENT DOCUMENTS

| | | |
|---|---|---|
| JP | 10-32404 A | 2/1998 |
| JP | 11-214908 | 6/1999 |
| JP | 11-195911 A | 7/1999 |
| JP | 2001-102824 A | 4/2001 |
| JP | 2002-217620 | 8/2002 |

OTHER PUBLICATIONS

Sakamoto, Koichi et al.; "A Millimeter Wave DR-VCO on Planar Type Dielectric Resonator with Small Size and Low Phase Noise"; IEICE Transactions on Electronics, vol. E82-C, No. 1, Jan. 1999, pp. 119-125.

* cited by examiner

DIELECTRIC RESONATOR DEVICE, OSCILLATOR AND TRANSMITTER-RECEIVER APPARATUS

FIELD OF THE INVENTION

The present invention relates to dielectric resonator devices, oscillators, and transmitter-receiver apparatuses suitable for high-frequency electromagnetic waves (high frequency signals), such as microwaves and millimeter waves.

BACKGROUND OF THE INVENTION

A typical dielectric resonator device used in a transmitter-receiver apparatus, such as a communication apparatus and a radar apparatus, is provided with a circuit substrate having a ground electrode and a transmission line, and a dielectric resonator which is attached to the circuit substrate at a position facing the ground electrode so as to be coupled to the transmission line (for example, see Patent Document 1).

Patent Document 1: Japanese Unexamined Patent Application Publication No. 11-214908

In such prior art, the dielectric resonator is defined by a TE010-mode resonator that has, for example, electrodes disposed on opposite surfaces of a dielectric substrate, and these electrodes are respectively provided with circular openings that face each other. The electrodes of the TE010-mode resonator are electrically connected to the ground electrode of the circuit substrate, such that the electrodes of the TE010-mode resonator are supported by the ground electrode.

In the prior art, the electrodes of the TE010-mode resonator are electrically connected to the ground electrode of the circuit substrate with, for example, a conductive projection. For this reason, if a bump, for example, is used as the conductive projection, a designated device or process is necessary for the attachment of the bump. This leads to an increase in manufacturing costs. Furthermore, since an inexpensive insulative resin material is used for the circuit substrate while a high dielectric ceramic substrate is used for the TE010-mode resonator, a thermal stress may be generated between the circuit substrate and the TE010-mode resonator due to a difference in coefficient of linear expansion between the two. This may possibly cause a disengagement of the joined section between the ground electrode of the circuit substrate and the electrodes of the TE010-mode resonator. The disengagement of the joined section induces a change in a current path, thus easily leading to fluctuation of the characteristics of the TE010-mode resonator.

SUMMARY OF THE INVENTION

In view of the circumstances of the prior art described above, it is an object of the present invention to provide a dielectric resonator device, an oscillator, and a transmitter-receiver apparatus having stable characteristics while requiring lower manufacturing costs.

In order to achieve the aforementioned object, the present invention is directed to a dielectric resonator device including a circuit substrate having a ground electrode and a transmission line; and a dielectric resonator which is attached to the circuit substrate at a position facing the ground electrode and is coupled to the transmission line. The dielectric resonator includes electrodes disposed on opposite surfaces of a dielectric substrate, the electrodes respectively having openings that face each other.

The present invention is characterized in that an insulating layer is provided between the ground electrode of the circuit substrate and the electrodes of the dielectric resonator so as to insulate the ground electrode from the electrodes, and one of the openings of the dielectric resonator is provided with an insulative adhesive for joining the dielectric resonator to the circuit substrate.

According to the present invention, the insulating layer is provided between the ground electrode of the circuit substrate and the electrodes of the dielectric resonator so as to insulate the ground electrode from the electrodes. Accordingly, a current path remains unchanged even if the adhesive is partially detached due to a difference in coefficient of linear expansion, thereby achieving stable characteristics. Furthermore, since the insulating layer intervenes the ground electrode of the circuit substrate and one of the electrodes of the dielectric resonator, the dielectric resonator can be positioned by the insulating layer in the height direction of the circuit substrate. This stabilizes the coupling amount between the transmission line and the dielectric resonator.

Furthermore, since the dielectric resonator and the circuit substrate are joined to each other with the insulative adhesive, the adhesion strength is greater in comparison to using a conductive adhesive, thereby achieving enhanced reliability and durability. Moreover, since the insulative adhesive is disposed in one of the openings of the dielectric resonator, the adhesive is prevented from protruding outward from the periphery of the dielectric resonator, which may be seen in a case where, for example, an adhesive is disposed in a peripheral region of the dielectric resonator. Therefore, a protruding portion of the adhesive is prevented from interfering with, for example, a package that houses the dielectric resonator. This implies that a small-size package, for example, can be used. Furthermore, the adhesive may be applied to any position within the opening of the dielectric resonator. This contributes to improved workability.

Furthermore, in the present invention, the insulating layer may surround the opening of the dielectric resonator.

According to the present invention, by providing the insulating layer in a surrounding fashion around the opening of the dielectric resonator, the insulating layer is sandwiched between the ground electrode of the circuit substrate and the corresponding electrode of the dielectric resonator. This prevents the dielectric resonator from tilting, thereby stabilizing the coupling characteristics with respect to the transmission line.

In this case, in the present invention, the insulating layer is preferably provided with a relief passage for guiding the insulative adhesive outward from the opening of the dielectric resonator.

According to the present invention, since the insulating layer may be provided with the relief passage for guiding the insulative adhesive outward from the opening of the dielectric resonator, an excess amount of the insulative adhesive can be guided outward through the relief passage. This prevents the dielectric resonator from becoming disengaged from the insulating layer, thereby achieving stable characteristics. Moreover, if the dielectric resonator is to be housed inside, for example, a package, the excess amount of the insulative adhesive can be guided by the relief passage to a position where the adhesive does not interfere with the package.

Furthermore, an oscillator equipped with the dielectric resonator device according to the present invention may be provided, and moreover, a transmitter-receiver apparatus, such as a communication apparatus and a radar apparatus, equipped with the dielectric resonator device according to the present invention may also be provided.

The application of the dielectric resonator device according to the present invention in an oscillator or a transmitter-receiver apparatus achieves stable characteristics of, for example, the oscillator and also improves the reliability and the assembly process thereof. Moreover, this also contributes to a higher yield rate as well as lower manufacturing costs.

Figure 1:
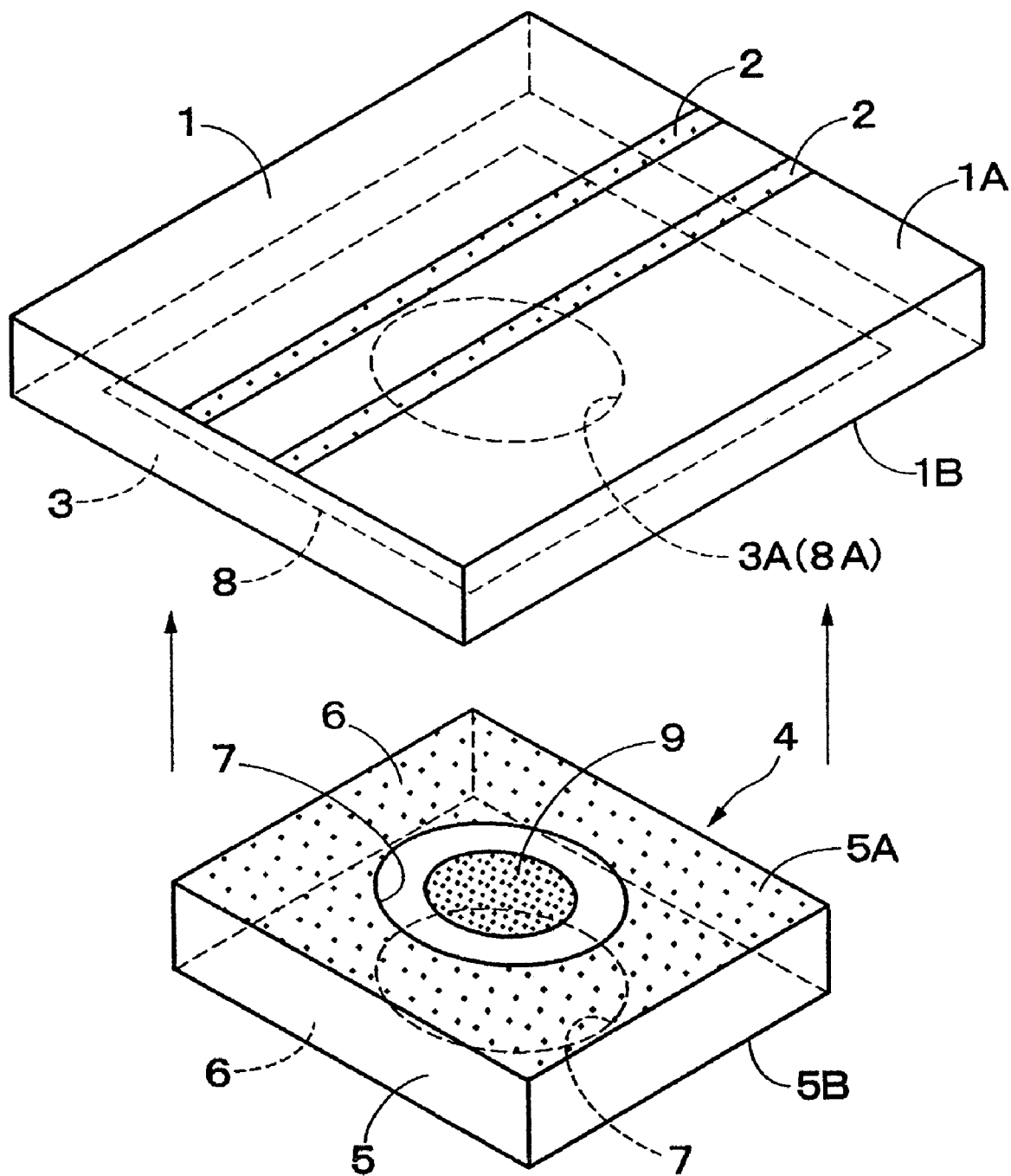
FIG. 1 is an exploded perspective view illustrating an exploded state of a dielectric resonator device according to a first embodiment.

REFERENCE NUMERALS 1, 21 circuit substrate
2, 24, 33 transmission line
3 ground electrode
4, 37 TE010-mode resonator
5 dielectric substrate
6 electrode
7 opening
8 insulating layer
9 insulative adhesive
11 relief path
41 communication apparatus (transmitter-receiver apparatus)
56 oscillator

DETAILED DESCRIPTION OF THE INVENTION

A dielectric resonator device, an oscillator, and a communication apparatus according to embodiments of the present invention will now be described with reference to the attached drawings.

FIGS. 1 to 5 illustrate a first embodiment. The first embodiment is directed to an example of a dielectric resonator device equipped with a TE010-mode resonator.

A circuit substrate 1 having various types of circuits for processing, for example, high frequency signals is formed of a substantially flat plate composed of a dielectric material, such as an insulative resin material and a ceramic material, and has a top surface 1A and a bottom surface 1B.

A pair of transmission lines 2 extend parallel to each other on the top surface 1A of the circuit substrate 1 and are defined by, for example, micro-strip lines. Each of the transmission lines 2 is formed of a strip-shaped conductive pattern and forms a coupled line coupled to the TE010-mode resonator, which will be described below.

A ground electrode 3 is disposed on the bottom surface 1B of the circuit substrate 1. The ground electrode 3 covers substantially the entire bottom surface 1B of the circuit substrate 1. Moreover, the ground electrode 3 has a circular opening 3A disposed at a position corresponding to a central portion of the circuit substrate 1, such that the circuit substrate 1 is partly exposed through the opening 3A. The opening 3A faces the two transmission lines 2 across the circuit substrate 1 and also faces one of openings 7 of a TE010-mode resonator 4, which will be described below. Furthermore, the opening 3A of the ground electrode 3 has, for example, a smaller diameter than each opening 7 of the TE010-mode resonator 4.

A TE010-mode resonator 4 functions as a dielectric resonator and includes a dielectric substrate 5 and electrodes 6, which will be described below.

The dielectric substrate 5 is composed of, for example, a ceramic material having a relative dielectric constant that is higher than that of the circuit substrate 1, and has a substantially flat rectangular shape (for example, a square shape with a thickness of 0.6 mm and with each side having about 3.3 mm). Moreover, the dielectric substrate 5 has a top surface 5A and a bottom surface 5B.

A pair of electrodes 6 are respectively disposed on the opposite surfaces 5A and 5B of the dielectric substrate 5. Each electrode 6 is formed of, for example, a thin film composed of a conductive metallic material. The electrodes 6 are provided with the openings 7 that face each other across the dielectric substrate 5. Excluding the openings 7, the two electrodes 6 respectively cover the opposite surfaces 5A and 5B of the dielectric substrate 5. The electrode 6 on the top surface 5A of the dielectric substrate 5 faces the ground electrode 3 of the circuit substrate 1 across an insulating layer 8.

Each opening 7 is a substantially circular through-hole disposed in a central portion of the corresponding electrode 6, such that the dielectric substrate 5 is partly exposed through the opening 7. The diameter of each opening 7 is set to a value corresponding to a wavelength kg, which corresponds to a resonant frequency in the dielectric substrate 5. Moreover, the two openings 7 are disposed facing each other across the dielectric substrate 5, such that a resonant mode in accordance with a TE010 mode is produced in the openings 7. The center of each opening 7 is substantially aligned with the center of the opening 3A of the ground electrode 3.

An insulating layer 8 is disposed between the ground electrode 3 of the circuit substrate 1 and one of the electrodes 6 of the TE010-mode resonator 4 and that surrounds the corresponding opening 7. The insulating layer 8 is composed of, for example, a resist material and is a thin film that covers a wider area than the dielectric substrate 5 (TE010-mode resonator 4). A central portion of the insulating layer 8 is provided with an opening 8A having substantially the same shape as the opening 3A. Moreover, the insulating layer 8 has, for example, a substantially uniform thickness and is disposed around the periphery of the opening 3A of the ground electrode 3. The insulating layer 8 also abuts on one of the electrodes 6 of the TE010-mode resonator 4. Consequently, the insulating layer 8 insulates the ground electrode 3 of the circuit substrate 1 from the electrodes 6 of the TE010-mode resonator 4. Moreover, the insulating layer 8 maintains the TE010-mode resonator 4 at a position distant from the circuit substrate 1 by the thickness of the insulating layer 8, and positions the TE010-mode resonator 4 in the thickness direction (height direction) of the circuit substrate 1.

An insulative adhesive 9 is disposed between the opening 3A of the circuit substrate 1 and one of the openings 7 of the TE010-mode resonator 4. The insulative adhesive 9 has, for example, a relative dielectric constant that is lower than that of the dielectric substrate 5, and is positioned in substantially the center of the circular openings 3A and 7. The insulative adhesive 9 joins the circuit substrate 1 and the dielectric substrate 5 together. Accordingly, the TE010-mode resonator 4 is fixed to the bottom surface 1B of the circuit substrate 1 with the insulative adhesive 9 at a position corresponding to the opening 3A, and is thus coupled to the transmission lines 2 via, for example, the opening 3A.

Figure 2:
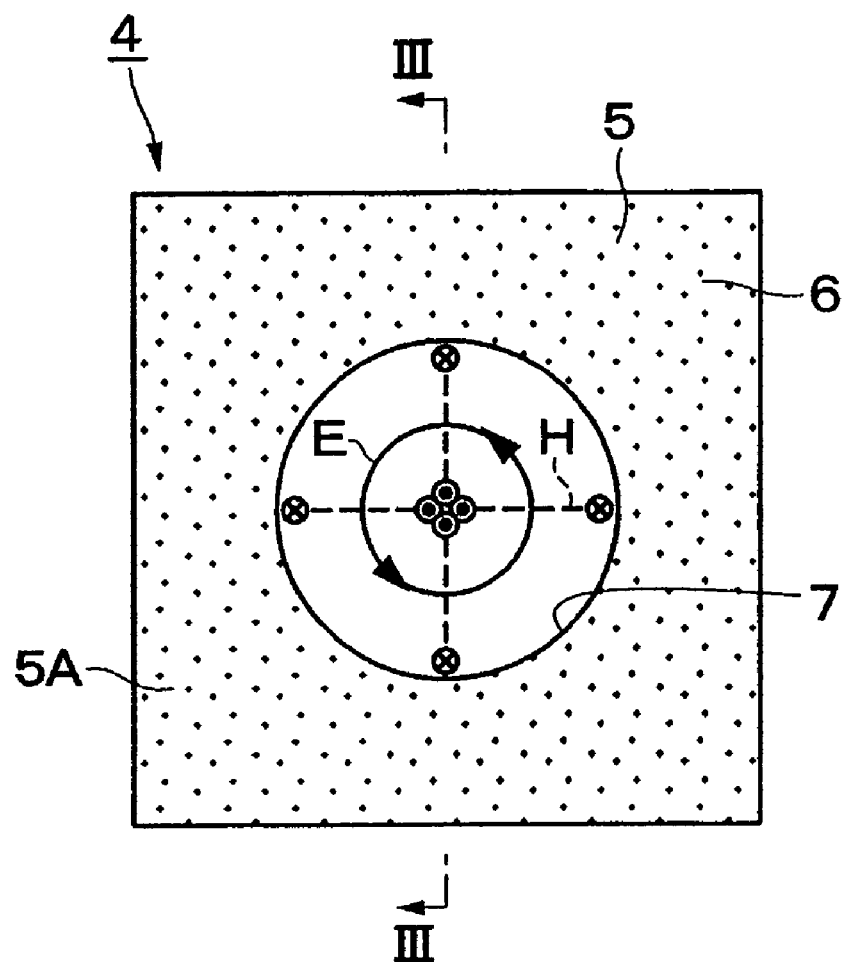
FIG. 2 is a plan view of a TE010-mode resonator shown in FIG. 1.
Figure 3:
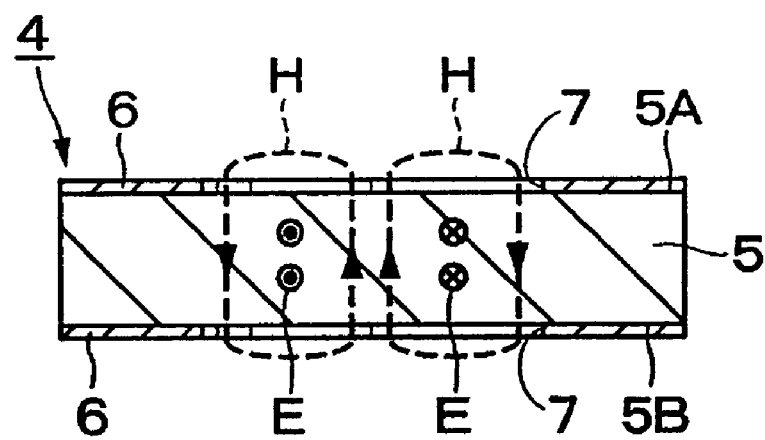
FIG. 3 is a cross-sectional view of the TE010-mode resonator taken along line III-III in FIG. 2.
Figure 4:
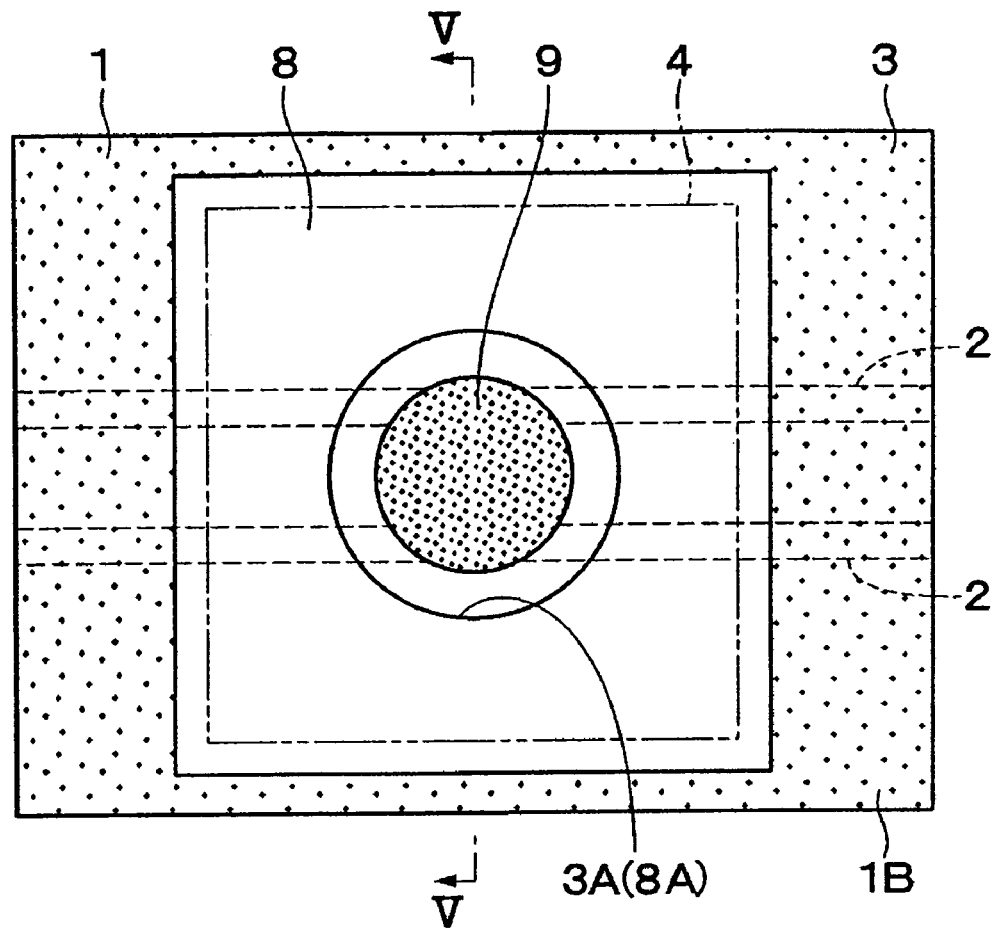
FIG. 4 is a bottom view of a circuit substrate having an insulating layer and an insulative adhesive attached thereto.
Figure 5:
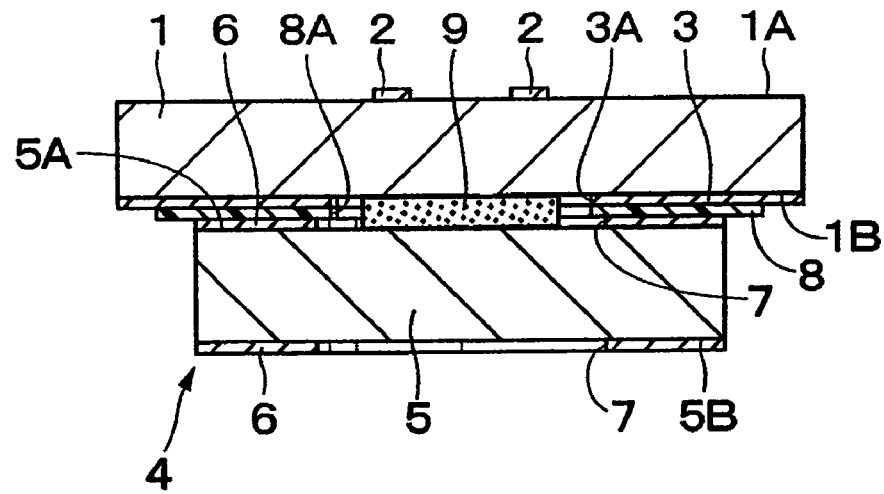
FIG. 5 is a cross-sectional view of the dielectric resonator device according to the first embodiment taken along line V-V in FIG. 4.

The dielectric resonator device according to the first embodiment has the structure described above. When the TE010-mode resonator 4 is in operation, a circular plane that connects the periphery edges of the openings 7 forms a short-circuit plane. Thus, as shown in FIGS. 2 and 3, an annular electric field E and a donut-shaped electric field H that surrounds the electric field E are formed in the openings 7. Accordingly, a high frequency signal in the TE010-mode resonator 4 resonates in a resonant mode in accordance with a TE010 mode, and moreover, the TE010-mode resonator 4 is coupled to the transmission lines 2 via, for example, the opening 3A, as shown in FIG. 5.

In the first embodiment, since the insulating layer 8 is provided for insulating the ground electrode 3 of the circuit substrate 1 from the electrodes 6 of the TE010-mode resonator 4, a current path remains unchanged even if the insulative adhesive 9 is partially detached due to a difference in coefficient of linear expansion between the circuit substrate 1 and the dielectric substrate 5. Accordingly, this achieves stable characteristics.

Moreover, since the insulating layer 8 intervenes the ground electrode 3 of the circuit substrate 1 and one of the electrodes 6 of the TE010-mode resonator 4, the TE010-mode resonator 4 is positioned by the insulating layer 8 in the height direction of the circuit substrate 1. This stabilizes the coupling amount between the transmission lines 2 and the TE010-mode resonator 4.

Furthermore, since the TE010-mode resonator 4 and the circuit substrate 1 are joined to each other with the insulative adhesive 9, the adhesion strength is greater in comparison to using a conductive adhesive, thereby achieving enhanced reliability and durability.

Furthermore, since the insulative adhesive 9 is disposed in one of the openings 7 of the TE010-mode resonator 4, the insulative adhesive 9 is prevented from protruding outward from the periphery of the TE010-mode resonator 4, which may be seen in a case where, for example, an adhesive is disposed in a peripheral region of the TE010-mode resonator 4. Accordingly, if the TE010-mode resonator 4 is to be housed inside, for example a package, a protruding portion of the insulative adhesive 9 is prevented from interfering with, for example, the package. Therefore, a small-size package can be used, thereby contributing to size reduction of the entire device. Furthermore, the insulative adhesive 9 may be applied to any position within the opening 7 of the TE010-mode resonator 4. This contributes to improved workability.

Figure 6:
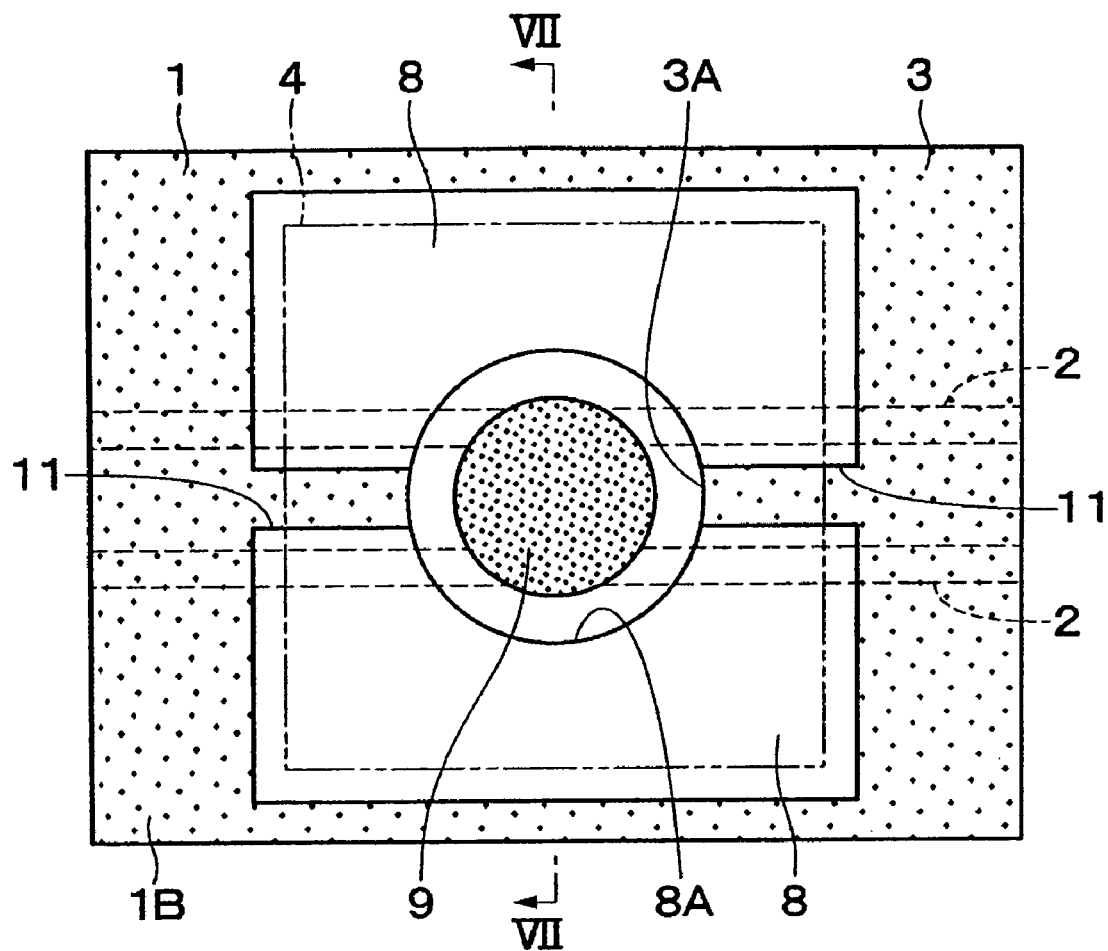
FIG. 6 is a bottom view of the circuit substrate included in the dielectric resonator device according to a second embodiment.
Figure 7:
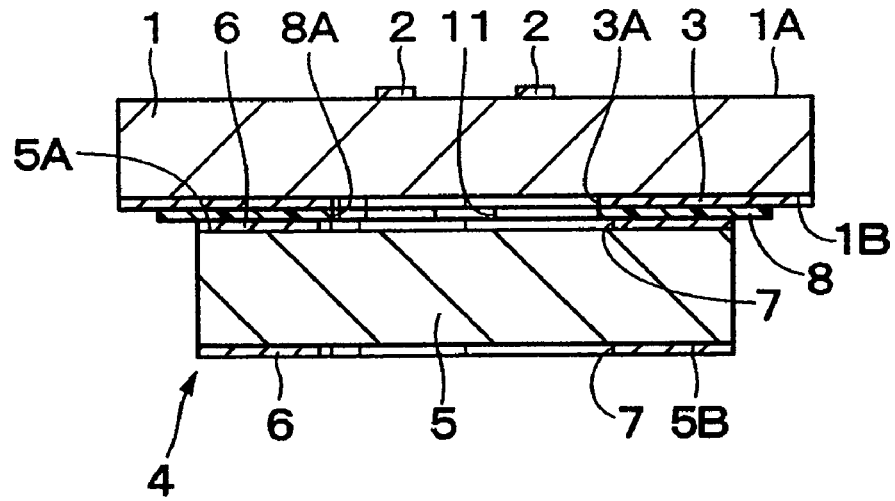
FIG. 7 is a cross-sectional view taken along line VII-VII in FIG. 6 and showing the dielectric resonator device according to the second embodiment without the insulative adhesive.

FIGS. 6 and 7 illustrate a dielectric resonator device according to a second embodiment. The second embodiment is characterized in that the insulating layer is provided with relief passages for guiding the insulative adhesive outward from the opening of the TE010-mode resonator. In the second embodiment, components corresponding to those in the first embodiment are indicated by the same reference numerals, and descriptions of those components will thus be omitted.

Two relief passages 11 are provided in the insulating layer 8. Each relief passage 11 is defined by, for example, a linear cutout extending outward from the openings 3A, 7 in the diameter direction thereof. The relief passages 11 extend in opposite directions from each other. Thus, the relief passages 11 divide the insulating layer 8 into two sections, and guide an excess amount of the insulative adhesive 9 outward from the opening 7 of the TE010-mode resonator 4.

The second embodiment achieves substantially the same advantage as the first embodiment. On the other hand, since the relief passages 11 are provided in the insulating layer 8 according to the second embodiment, an excess amount of the insulative adhesive 9 can be released outward from the opening 7 of the TE010-mode resonator 4 through the relief passages 11. This prevents the TE010-mode resonator 4 from becoming disengaged from the insulating layer 8, which may be caused by the excess amount of the insulative adhesive 9. Therefore, the coupling amount between the TE010-mode resonator 4 and the transmission lines 2 can be maintained substantially constant, thereby achieving stable characteristics.

Furthermore, if the TE010-mode resonator 4 is to be housed inside, for example, a package (not shown), the relief passages 11 can be used to guide the excess amount of the insulative adhesive 9 to a position where the insulative adhesive 9 does not interfere with the package. Specifically, the package may be provided with gaps for holding the excess amount of the insulative adhesive 9 at the outer ends of the relief passages 11 (i.e. left and right sides of the TE010-mode resonator 4 in FIG. 6), and the other sections of the package may be disposed adjacent to the TE010-mode resonator 4. Accordingly, the package does not need to be needlessly increased in size, thereby contributing to size reduction of the entire dielectric resonator device including the package.

Although the insulating layer 8 is provided with the two relief passages 11 in the second embodiment, the present invention is not limited to such a configuration. Alternatively, the insulating layer may be provided with, for example, a single relief passage or three or more relief passages.

Figure 8:
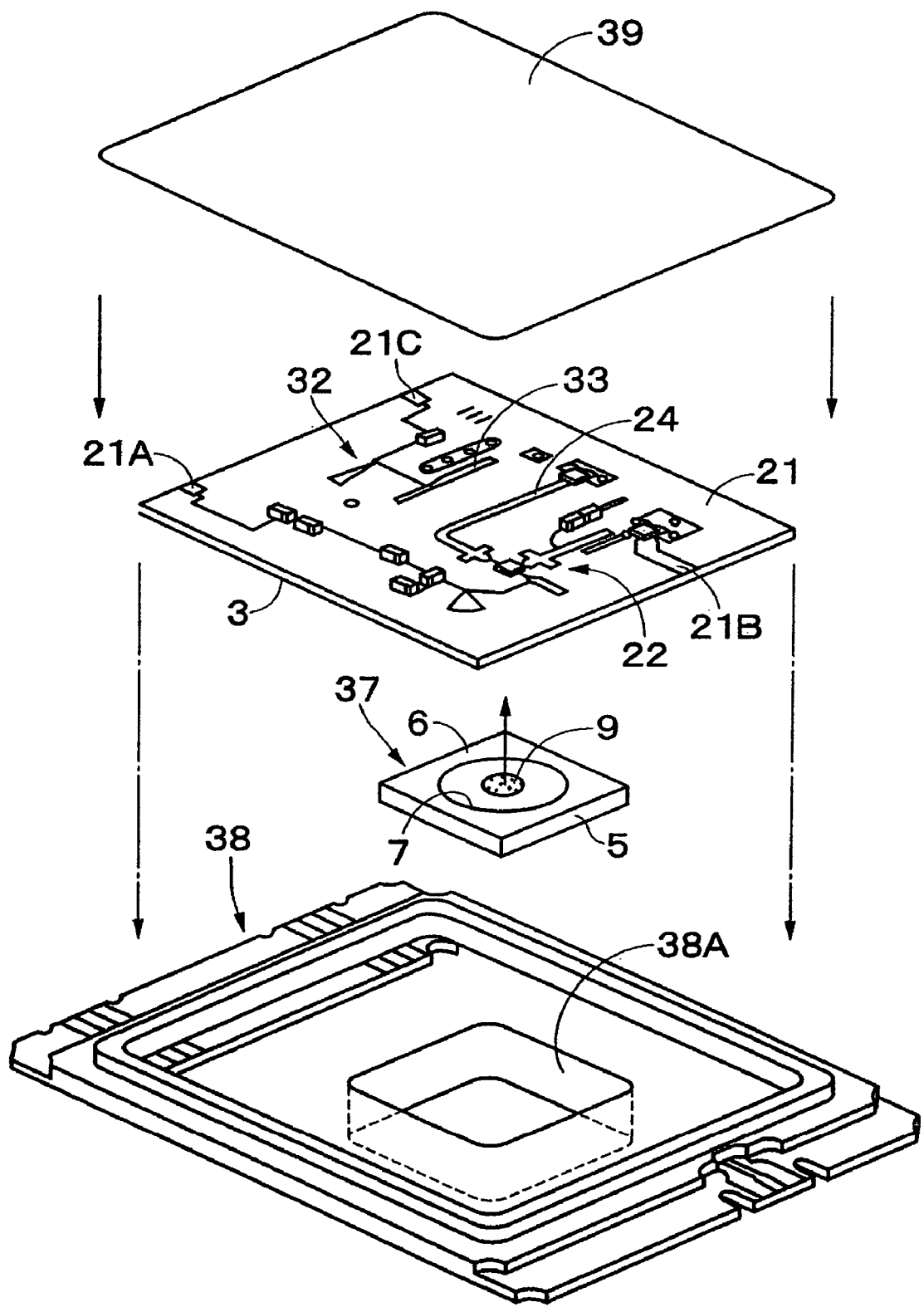
FIG. 8 is an exploded perspective view illustrating an exploded state of an oscillator according to a third embodiment.
Figure 9:
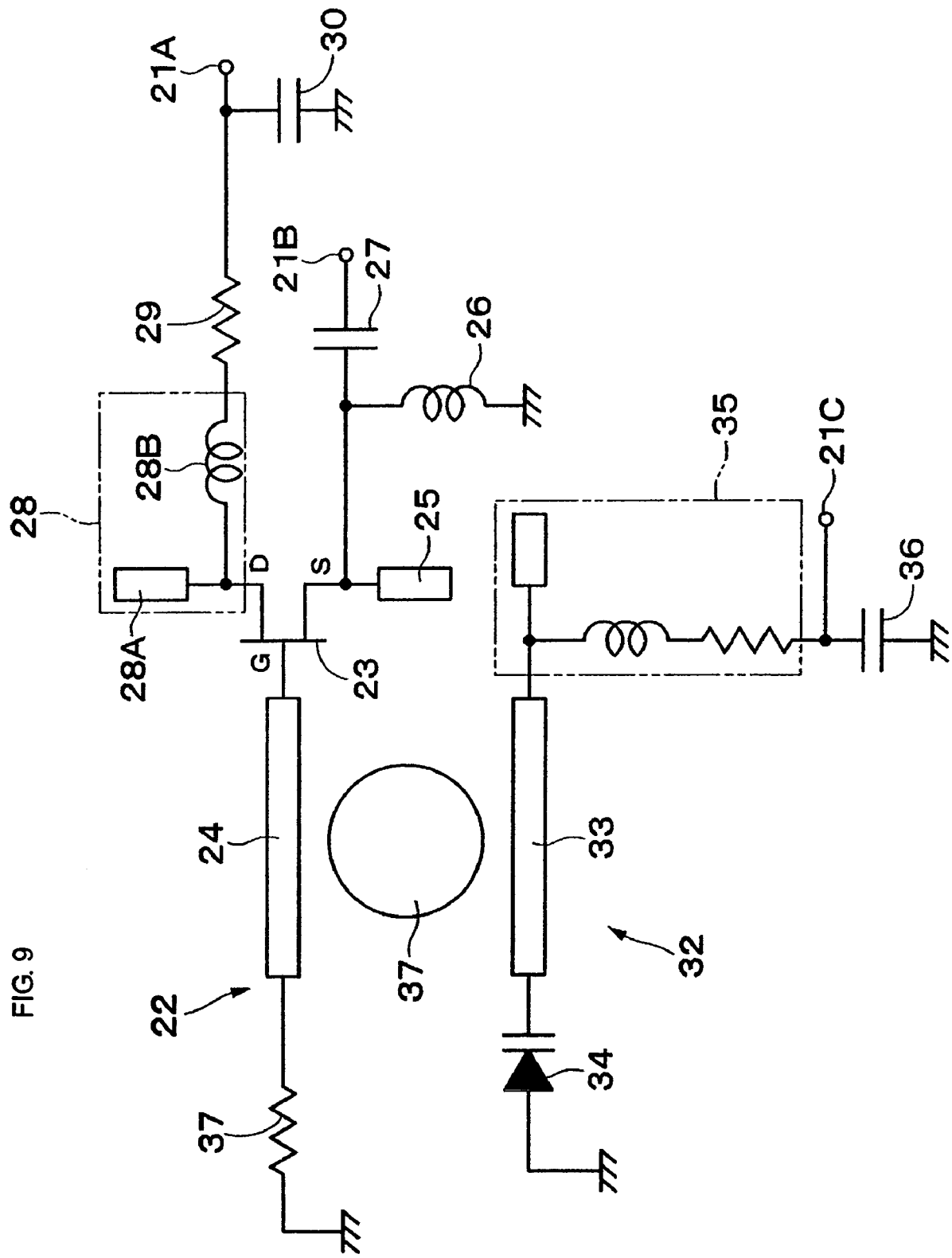
FIG. 9 is an equivalent circuit diagram of the oscillator shown in FIG. 8.

FIGS. 8 and 9 illustrate a third embodiment. The third embodiment is directed to an oscillator equipped with the dielectric resonator device according to the present invention. In the third embodiment, components corresponding to those in the first embodiment are indicated by the same reference numerals, and descriptions of those components will thus be omitted.

The oscillator of the third embodiment includes a circuit substrate 21, composed of a dielectric material, preferably a ceramic material or resin material having a dielectric constant that is lower than that of the dielectric substrate 5, and has a substantially flat rectangular shape. A bottom surface of the circuit substrate 21 is provided with the ground electrode 3 that covers substantially the entire bottom surface. The ground electrode 3 has a circular opening (not shown), which is substantially the same as that in the first embodiment and is disposed at a position facing transmission lines 24 and 33, which will be described below.

An oscillation circuit unit 22 is provided in the circuit substrate 21. The oscillation circuit unit 22 includes, for example, a field effect transistor 23 (which will be referred to as an FET 23 hereinafter) and a transmission line 24 defined by a micro-strip line. The oscillation circuit unit 22 is supplied with supply voltage through a power terminal 21A. The oscillation circuit unit 22 oscillates a signal of a predetermined oscillation frequency (resonant frequency) set by a TE010-mode resonator 37, which will be described below, and outputs this signal through an output terminal 21B.

The FET 23 has a gate terminal G, which is connected to a base end of the transmission line 24. The FET 23 also has a source terminal S, which is connected to a stub 25 for controlling a feedback frequency and to a bias coil 26. Moreover, the source terminal S is also connected to the output terminal 21B via a coupled line 27 for blocking a direct-current component.

On the other hand, the FET 23 also has a drain terminal D, which is connected to the power terminal 21A via a filter circuit 28 including a stub 28A and a coil 28B and via a bias resistor 29. The power terminal 21A is connected to a surge-eliminating capacitor 30. Furthermore, a front end of the transmission line 24 is connected to a terminating resistor 31.

A frequency control circuit unit 32 is provided on the circuit substrate 21. The frequency control circuit unit 32 mainly includes the transmission line 33 defined by a microstrip line disposed adjacent to the TE010-mode resonator 37, and a variable capacitance diode (varactor diode) 34 connected to a front end of the transmission line 33 and functioning as a modulation element. The variable capacitance diode 34 has its cathode terminal connected to the transmission line 33 and has its anode terminal connected to a ground. On the other hand, the transmission line 33 has a base end connected to a control input terminal 21C via a filter circuit 35. The control input terminal 21C is connected to a capacitor 36.

The frequency control circuit unit 32 changes the capacitance of the variable capacitance diode 34 in response to a control voltage applied to the control input terminal 21C so as to control the oscillation frequency (resonant frequency).

A TE010-mode resonator 37 is attached to the bottom surface of the circuit substrate 21. Substantially similar to the TE010-mode resonator 4 according to the first embodiment, the TE010-mode resonator 37 mainly includes the dielectric substrate 5, the electrodes 6, and the openings 7. The TE010-mode resonator 37 is disposed at a position facing the transmission lines 24 and 33 across the circuit substrate 21, and is connected to the oscillation circuit unit 22 and the frequency control circuit unit 32 via the transmission lines 24 and 33.

Similar to the first embodiment, an insulating layer (not shown) composed of, for example, a resist material is disposed between the ground electrode 3 of the circuit substrate 21 and the electrodes 6 of the TE010-mode resonator 37. The insulating layer insulates the electrodes 6 of the TE010-mode resonator 37 from the ground electrode 3 of the circuit substrate 21. Furthermore, one of the openings 7 in the TE010-mode resonator 37 has the insulative adhesive 9 therein, such that the TE010-mode resonator 37 is attached to the circuit substrate 21 with the insulative adhesive 9.

A package 38 houses the circuit substrate 21 together with the TE010-mode resonator 37. The package 38 has a shape of a box with a bottom surface, and is composed of, for example, alumina. A central portion of the package 38 is provided with a housing recess 38A for housing the TE010-mode resonator 37. Moreover, in a state where the circuit substrate 21 and the like are housed in the package 38, an upper opening of the package 38 is covered with a cap 39 plated with, for example, nickel.

The oscillator according to the third embodiment has the structure described above, and operates in the following manner.

When a driving voltage is applied to the power terminal 21A, a signal corresponding to a resonant frequency of the TE010-mode resonator 37 is input to the gate terminal G of the FET 23. Thus, the oscillation circuit unit 22 and the TE010-mode resonator 37 form a band reflex oscillation circuit. Accordingly, the FET 23 amplifies the signal corresponding to the resonant frequency of the TE010-mode resonator 37 and outputs the signal outward through the output terminal 21B.

Furthermore, since the TE010-mode resonator 37 is connected to the frequency control circuit unit 32 that includes the variable capacitance diode 34, the resonant frequency of the TE010-mode resonator 37 can be set adjustably in accordance with a value of the control voltage applied to the control input terminal 21C. Accordingly, the entire oscillator functions as a voltage controlled oscillator (VCO).

In the third embodiment, the TE010-mode resonator 37 that is similar to that in the first embodiment is used to form a voltage controlled oscillator. Accordingly, this stabilizes the characteristics of the oscillator and also improves the reliability and the assembly efficiency thereof, thereby contributing to a higher yield rate and lower manufacturing costs.

Although the TE010-mode resonator according to the first embodiment is used as the TE010-mode resonator 37 in the third embodiment, the TE010-mode resonator according to the second embodiment may be used as an alternative.

Figure 10:
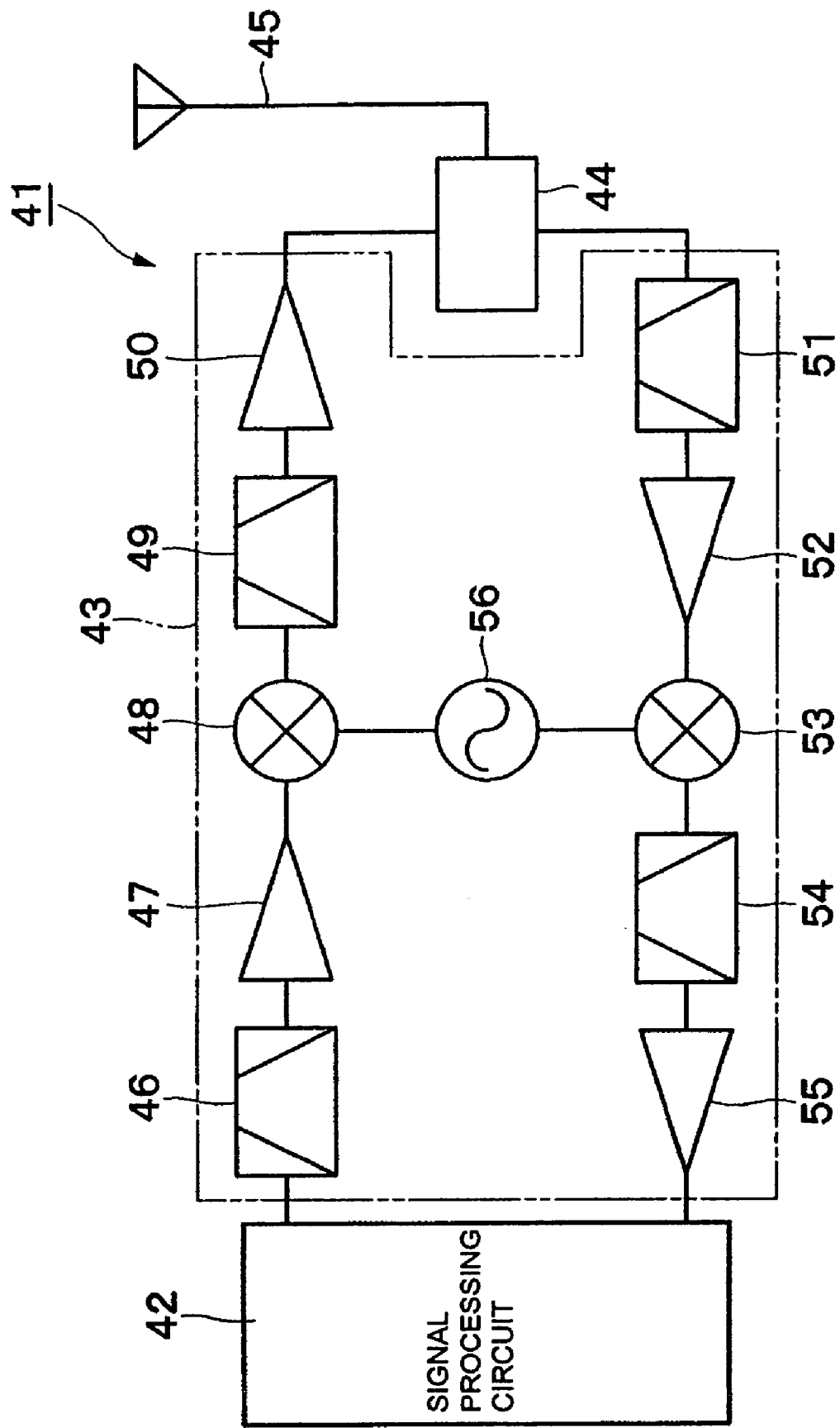
FIG. 10 is a block diagram of a communication apparatus according to a fourth embodiment.

FIG. 10 illustrates a fourth embodiment of the present invention. The fourth embodiment is directed to a communication apparatus 41 serving as a transmitter-receiver apparatus and including the oscillator equipped with the TE010-mode resonator according to the present invention.

The communication apparatus 41 includes, for example, a signal processing circuit 42, a high-frequency module 43 that is connected to the signal processing circuit 42 and that receives and outputs high frequency signals, and an antenna 45 that is connected to the high-frequency module 43 and that sends or receives the high frequency signals through an antenna duplexer 44.

The high-frequency module 43 has a transmitting portion and a receiving portion. The transmitting portion is defined by a band pass filter 46, an amplifier 47, a mixer 48, a band pass filter 49, and a power amplifier 50 that are connected between an output of the signal processing circuit 42 and the antenna duplexer 44, whereas the receiving portion is defined by a band pass filter 51, a low noise amplifier 52, a mixer 53, a band pass filter 54, and an amplifier 55 that are connected between the antenna duplexer 44 and an input of the signal processing circuit 42. The mixers 48 and 53 are connected to an oscillator 56 equipped with the TE010-mode resonator according to the present invention, as in the third embodiment.

The communication apparatus according to the fourth embodiment has the structure described above and operates in the following manner.

In a transmission mode, an intermediate frequency signal (IF signal) output from the signal processing circuit 42 is sent to the band pass filter 46 where an undesired portion of the signal is removed. Subsequently, the signal is amplified by the amplifier 47 and is then input to the mixer 48. The mixer 48 mixes the intermediate frequency signal and a carrier from the oscillator 56 together so as to up-convert the signal to a high frequency signal (RF signal). The high frequency signal output from the mixer 48 is sent to the band pass filter 49 where an undesired portion of the signal is removed. The signal is then amplified to a transmission power by the power amplifier 50, and is output from the antenna 45 via the antenna duplexer 44.

On the other hand, in a receiving mode, a high frequency signal received from the antenna 45 is input to the band pass filter 51 via the antenna duplexer 44. In the band pass filter 51, an undesired portion of the high frequency signal is removed. Subsequently, the signal is amplified by the low noise amplifier 52 and is input to the mixer 53. The mixer 53 mixes the high frequency signal and a carrier from the oscillator 56 together so as to down-convert the signal to an intermediate frequency signal. The intermediate frequency signal output from the mixer 53 is sent to the band pass filter 54 where an undesired portion of the signal is removed. The signal is then amplified by the amplifier 55, and is input to the signal processing circuit 42.

Because the communication apparatus in the fourth embodiment is equipped with the oscillator 56 that includes the TE010-mode resonator according to the present invention having reduced radiation, the fourth embodiment achieves substantially the same advantage as the third embodiment.

Although the fourth embodiment is directed to an example in which the oscillator 56 equipped with the TE010-mode resonator according to the present invention is applied in the communication apparatus 41, the oscillator 56 may alternatively be applied in, for example, a radar apparatus.

Furthermore, each of the embodiments includes the TE010-mode resonator 4 or 37 having the circular openings 7. However, the present invention is not limited to such a shape. For example, a dielectric resonator with openings having other types of shapes, such as a rectangle, may be used as an alternative.

Furthermore, although the TE010-mode resonator 4 or 37 is attached to one of the surfaces of the circuit substrate 1 or 21 that is opposite to the surface with the transmission lines 2, or 24 and 33 in each embodiment, the TE010-mode resonator 4 or 37 may alternatively be attached to the circuit substrate on the same surface as the transmission lines.

Furthermore, in each of the above embodiments, the transmission lines 2, or 24 and 33 are defined by micro-strip lines. Alternatively, for example, strip lines and coplanar lines may be used as the transmission lines.

The invention claimed is:

1. A dielectric resonator device comprising:
   a circuit substrate having a ground electrode and a transmission line;
   a dielectric resonator attached to the circuit substrate at a position facing the ground electrode and coupled to the transmission line, the dielectric resonator including a dielectric substrate and electrodes disposed on opposite surfaces of the dielectric substrate, the electrodes respectively having openings that face each other;
   an insulating layer located between the ground electrode of the circuit substrate and the electrodes of the dielectric resonator so as to insulate the ground electrode from the electrodes; and
   an insulative adhesive provided at one of the openings of the electrodes of the dielectric resonator for joining the dielectric resonator to the circuit substrate such that the electrode of the dielectric resonator facing the ground electrode of the circuit substrate is electrically insulated from the ground electrode of the circuit substrate.

2. The dielectric resonator device according to claim 1, wherein the insulating layer surrounds the one of the openings of the dielectric resonator.

3. The dielectric resonator device according to claim 2, wherein the insulating layer is provided with a relief passage for guiding the insulative adhesive outward from the one of the openings of the dielectric resonator.

4. An oscillator comprising the dielectric resonator device according to claim 1.

5. A transmitter-receiver apparatus comprising the dielectric resonator device according to claim 1.

6. A dielectric resonator device comprising:
   a circuit substrate having a ground electrode and a transmission line;
   a dielectric resonator attached to the circuit substrate at a position facing the ground electrode and coupled to the transmission line, the dielectric resonator including a dielectric substrate and electrodes disposed on opposite surfaces of the dielectric substrate;
   an insulating layer located between the ground electrode of the circuit substrate and one of the electrodes of the dielectric resonator; and
   an insulative adhesive provided between the dielectric resonator and the circuit substrate for joining the dielectric resonator to the circuit substrate such that the electrode of the dielectric resonator facing the ground electrode of the circuit substrate is electrically insulated from the ground electrode of the circuit substrate.

7. The dielectric resonator device according to claim 6, wherein the electrodes of the dielectric resonator respectively having openings that face each other, and the insulating layer surrounds one of the openings.

8. The dielectric resonator device according to claim 7, wherein the insulating layer is provided with a relief passage for guiding the insulative adhesive outward from the one of the openings of the electrodes of the dielectric resonator.

9. An oscillator comprising the dielectric resonator device according to claim 6.

10. A transmitter-receiver apparatus comprising the dielectric resonator device according to claim 6.

* * * * *